(12) United States Patent
Karpman

(10) Patent No.: US 6,946,742 B2
(45) Date of Patent: Sep. 20, 2005

(54) PACKAGED MICROCHIP WITH ISOLATOR HAVING SELECTED MODULUS OF ELASTICITY

(75) Inventor: Maurice S. Karpman, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/326,640

(22) Filed: Dec. 19, 2002

(65) Prior Publication Data

US 2004/0119143 A1 Jun. 24, 2004

(51) Int. Cl.$^7$ .............................................. H01L 23/48
(52) U.S. Cl. ...................... 257/778; 257/707; 257/788; 257/789
(58) Field of Search ................................ 257/707, 778, 257/788, 789, 618, 783

(56) References Cited

U.S. PATENT DOCUMENTS

| | | | |
|---|---|---|---|
| 4,710,744 A | 12/1987 | Wamstad ........................ 338/4 |
| 4,740,410 A | 4/1988 | Muller et al. ................ 428/133 |
| 4,800,758 A | 1/1989 | Knecht et al. ................. 73/727 |
| 4,872,047 A | 10/1989 | Fister et al. ................... 357/67 |
| 4,918,032 A | 4/1990 | Jain et al. .................... 437/228 |
| 4,948,757 A | 8/1990 | Jain et al. .................... 437/240 |
| 5,105,258 A | 4/1992 | Silvis et al. ................. 257/748 |
| 5,207,102 A | 5/1993 | Takahashi et al. ............. 73/727 |
| 5,241,133 A | 8/1993 | Mullen, III et al. ........ 174/52.4 |
| 5,273,939 A | 12/1993 | Becker et al. ............... 437/209 |
| 5,315,155 A | 5/1994 | O'Donnelly et al. ......... 257/711 |
| 5,336,928 A | 8/1994 | Neugebauer et al. ........ 257/758 |
| 5,468,999 A | 11/1995 | Lin et al. .................... 257/784 |
| 5,515,732 A | 5/1996 | Willcox et al. ................ 73/724 |
| 5,939,633 A | 8/1999 | Judy ........................ 73/514.32 |
| 5,945,605 A | 8/1999 | Julian et al. .................. 73/727 |
| 5,994,161 A | 11/1999 | Bitko et al. .................... 438/53 |
| 6,137,170 A | 10/2000 | Ujiie et al. ................... 257/711 |
| 6,169,328 B1 * | 1/2001 | Mitchell et al. ............. 257/778 |
| 6,309,915 B1 * | 10/2001 | Distefano .................... 438/127 |
| 6,317,326 B1 * | 11/2001 | Vogel et al. ................. 361/704 |
| 6,505,511 B1 | 1/2003 | Geen et al. ............... 73/504.12 |
| 6,573,609 B2 * | 6/2003 | Fjelstad et al. .............. 257/778 |
| 6,617,683 B2 * | 9/2003 | Lebonheur et al. .......... 257/707 |
| 6,667,557 B2 * | 12/2003 | Alcoe et al. ................. 257/778 |
| 6,670,699 B2 * | 12/2003 | Mikubo et al. .............. 257/678 |
| 6,768,196 B2 | 7/2004 | Harney et al. ............... 257/729 |
| 2001/0055836 A1 | 12/2001 | Kunda ......................... 438/108 |

FOREIGN PATENT DOCUMENTS

| WO | WO 91/05368 | 4/1991 | ........... H01L/23/13 |
|---|---|---|---|
| WO | WO 2004/022477 A1 | 3/2004 | ........... H01L/21/58 |

OTHER PUBLICATIONS

Blackwell, The Electronic Packaging Handbook, CRC Press LLC, pp. 2–3, 7–1, 7–3, 7–12, A–9, and A–11, 2000.

Brown, Advanced Electronic Packaging With Emphasis on Multichip Modules, Institute of Electrical and Electronics Engineers, Inc., pp. 4, 8, 568, 1999.

Tummala et al., Microelectronics Packaging Handbook Semiconductor Packaging Part II, Second Edition, Chapman & Hall, pp. II–12, 1997.

(Continued)

Primary Examiner—David Nelms
Assistant Examiner—Dao H. Nguyen
(74) Attorney, Agent, or Firm—Bromberg & Sunstein LLP

(57) ABSTRACT

A packaged microchip has a stress sensitive microchip, a package having a package modulus of elasticity, and an isolator between the microchip and the package. The isolator has an isolator modulus of elasticity that has a relationship with the package modulus of elasticity. This relationship causes no more than a negligible thermal stress to be transmitted to the microchip.

13 Claims, 3 Drawing Sheets

OTHER PUBLICATIONS

Pecht, Handbook of Electronic Package Design, Marcel Dekker, Inc., pp. 173, 179, 196, 210, 736, 744, 821, and 832, 1991.

Heuberger, Mikromechanik, Springer Verlag A.G., pp. 470–476, 1989. With translation.

U.S. Appl. No. 10/234,215, filed Sep. 4, 2002, Harney et al.; Packaged Microchip with Isolation.

Patent Abstracts of Japan, vol. 009, No. 216 (E–340), Sep. 3, 1985 & JP 60 077434 A (Mitsubishi Denki KK), May 2, 1985 abstract.

Patent Abstracts of Japan, vol. 1995, No. 09, Oct. 31, 1995 & JP 07 142518 A (Hitachi LTD), Jun. 2, 1995 abstract.

Patent Abstracts of Japan, vol. 1996, No. 09, Sep. 30, 1996 & JP 08 116007 A (NEC Corp.), May 7, 1996 abstract.

Patent Abstracts of Japan, vol. 017, No. 672 (E–1474), Dec. 10, 1993 & JP 05 226501 A (Nissan Motor Co. LTD), Sep. 3, 1993 abstract.

Patent Abstracts of Japan, vol. 012, No. 111 (E–598), Apr. 8, 1988 & JP 62 241355 A (Hitachi LTD; others: 01), Oct. 22, 1987 abstract.

Department of Defense, Test Method Standard Microcircuits, FSC 5962, completed 1997.

* cited by examiner

PACKAGED MICROCHIP WITH ISOLATOR HAVING SELECTED MODULUS OF ELASTICITY

FIELD OF THE INVENTION

The invention generally relates microchips and, more particularly, the invention relates packaging techniques for microchips.

BACKGROUND OF THE INVENTION

Microelectromechanical systems ("MEMS") are used in a growing number of applications. For example, MEMS currently are implemented as angular rate sensors to detect pitch angles of airplanes, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

The associated electronics, substrate, and movable structure typically are formed on one or more dies (referred to herein simply as a "die") that are secured within a package. For example, the package, which typically hermetically seals the die, may be produced from ceramic or plastic. The package includes interconnects that permit the electronics to transmit the movement data to the external devices. To secure the die to the package interior, the bottom surface of the die commonly is bonded (e.g., with an adhesive or solder) to an internal surface (e.g., a die attach pad) of the package. Accordingly, substantially all of the area of the bottom die surface is bonded to the internal surface the package.

Problems can arise, however, when the temperatures of the package and/or die change. In particular, because both surfaces typically have different coefficients of thermal expansion and different moduli of elasticity, the package can apply a mechanical stress to the substrate of the die. This stress (referred to in the art as "linear stress" or "thermal stress," which, in this case, is thermally induced) undesirably can bend or flex the die substrate to an unknown curvature. Substrate bending or flexing consequently can affect movement of the die structures and the functioning of the electronics, thus causing the output data representing the property being measured (e.g., acceleration) to be erroneous.

SUMMARY OF THE INVENTION

In accordance with one aspect of the invention, a packaged microchip has a stress sensitive microchip, a package having a package modulus of elasticity, and an isolator between the microchip and the package. The isolator has an isolator modulus of elasticity that has a relationship with the package modulus of elasticity. This relationship causes no more than a negligible thermal stress to be transmitted to the microchip.

The isolator modulus of elasticity illustratively may be greater than or equal to about 100 Gpa. In some embodiments, the isolator modulus of elasticity may be either greater than or equal to the package modulus of elasticity. Among other things, the stress sensitive microchip may be a MEMS device implementing an inertial sensing device (e.g., an accelerometer or an angular rate sensor). The isolator may include one of silicon carbide, boron nitride, and aluminum nitride.

The negligible thermal stress produces no more than a negligible performance effect upon the microchip. In some embodiments, the isolator has an isolator thickness that is inversely related to the isolator modulus of elasticity.

In other embodiments, the microchip has a bottom surface having a bottom surface area, and the isolator has a top surface with a top surface area facing the microchip bottom surface. The top surface area is substantially the same as the bottom surface area.

In accordance with another aspect of the invention, a method of producing a packaged microchip provides a wafer having a plurality of individual devices implemented thereon, and a package having a package modulus of elasticity. An isolator also is selected, where the isolator is formed from an isolator material having an isolator modulus of elasticity. The isolator material is selected based upon the package modulus of elasticity. The method then bonds the isolator to the wafer to produce an intermediate wafer, and dices the intermediate wafer to produce a plurality of diced intermediate wafers. At least one of the diced intermediate wafers then is bonded to the package.

In some embodiments, the isolator modulus of elasticity and package modulus of elasticity have a relationship that causes no greater than a negligible thermal stress to be transmitted to the at least one diced intermediate wafer after the at least one diced intermediate wafer is bonded to the package. Moreover, a thickness for the isolator may be selected, where the thickness is inversely related to the isolator modulus of elasticity. In illustrative embodiments, the individual devices include MEMS devices.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a packaged microchip (e.g., a microelectromechanical system, also referred to herein as a "MEMS") includes an isolator that secures a microchip within the interior of a conventional package. The material and dimensions of the isolator are selected to minimize microchip stress (e.g., thermal stress caused by the package) to negligible levels. Details of this and other embodiments are discussed below.

Figure 1:
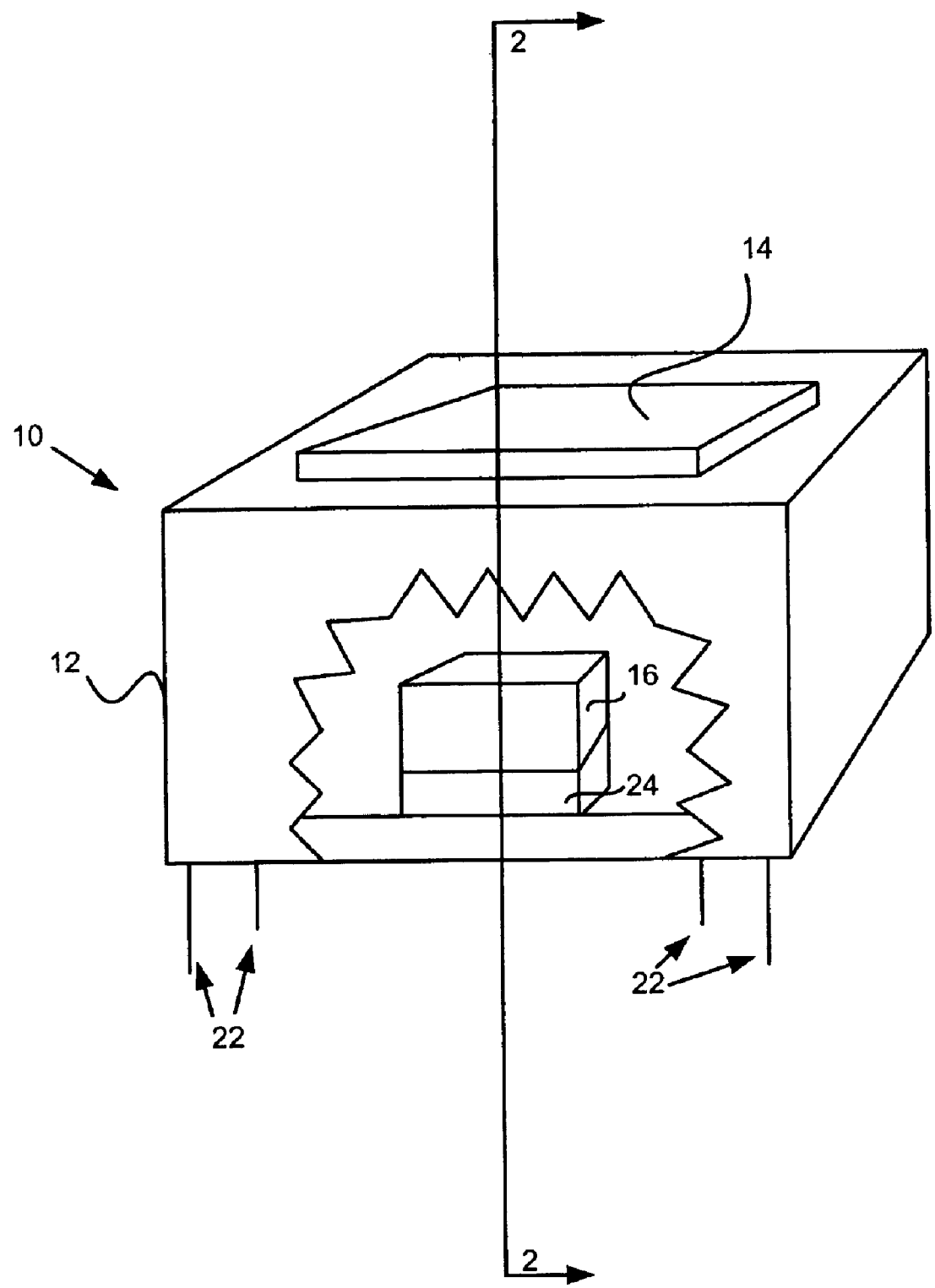
FIG. 1 schematically shows a partially cut-away view of a packaged microchip that may be produced in accordance with illustrative embodiments of the invention.

FIG. 1 schematically shows a partially cut-away isometric view of a packaged microchip 10 that can implement various embodiments of the invention. In illustrative embodiments, the packaged microchip 10 is a MEMS device implemented as an angular rate sensor. Accordingly, for illustrative purposes, various embodiments are discussed herein as a MEMS angular rate sensor. The MEMS device shown in FIGS. 1 and 2 thus is identified as angular rate sensor 10. It should be noted, however, that discussion of various embodiments as a MEMS angular rate sensor is exemplary only and thus, not intended to limit all embodiments of the invention. Accordingly, some embodiments may apply to other types of microchip devices, such as integrated circuits. In addition, embodiments of the invention can be applied to other types of MEMS devices, such as MEMS-based optical switching devices and MEMS-based accelerometers. In addition, embodiments of the invention can be applied to microchip devices mounted in packages that are not hermetically sealed, such as cavity plastic packages and the like.

The angular rate sensor 10 shown in FIG. 1 includes a conventional package 12, a lid 14 to hermetically seal the package 12, and a conventional angular rate sensor die 16 secured within the sealed interior 32. The angular rate sensor die 16 includes the well known mechanical structure and electronics discussed below with regard to FIG. 2) that measure angular rate in a given axis. A plurality of pins 22 extending from the package 12 electrically connect with the angular rate sensor die 16 to permit electrical communication between the angular rate sensor electronics and an exterior device (e.g., a computer).

Rather than being directly bonded to the interior surface of the package 12, the angular rate sensor die 16 is bonded to an isolator 24, which itself is bonded to the interior 32 of the package 12. In illustrative embodiments of the invention, the isolator 24 is formed from a material having 1) a substantially matched coefficient of thermal expansion (hereinafter "CTE") to the material forming the die 16, and 2) a modulus of elasticity that attenuates stress (transmitted from the package 12 to the die 16) to substantially negligible levels. Details of these material properties are discussed below.

Figure 2:
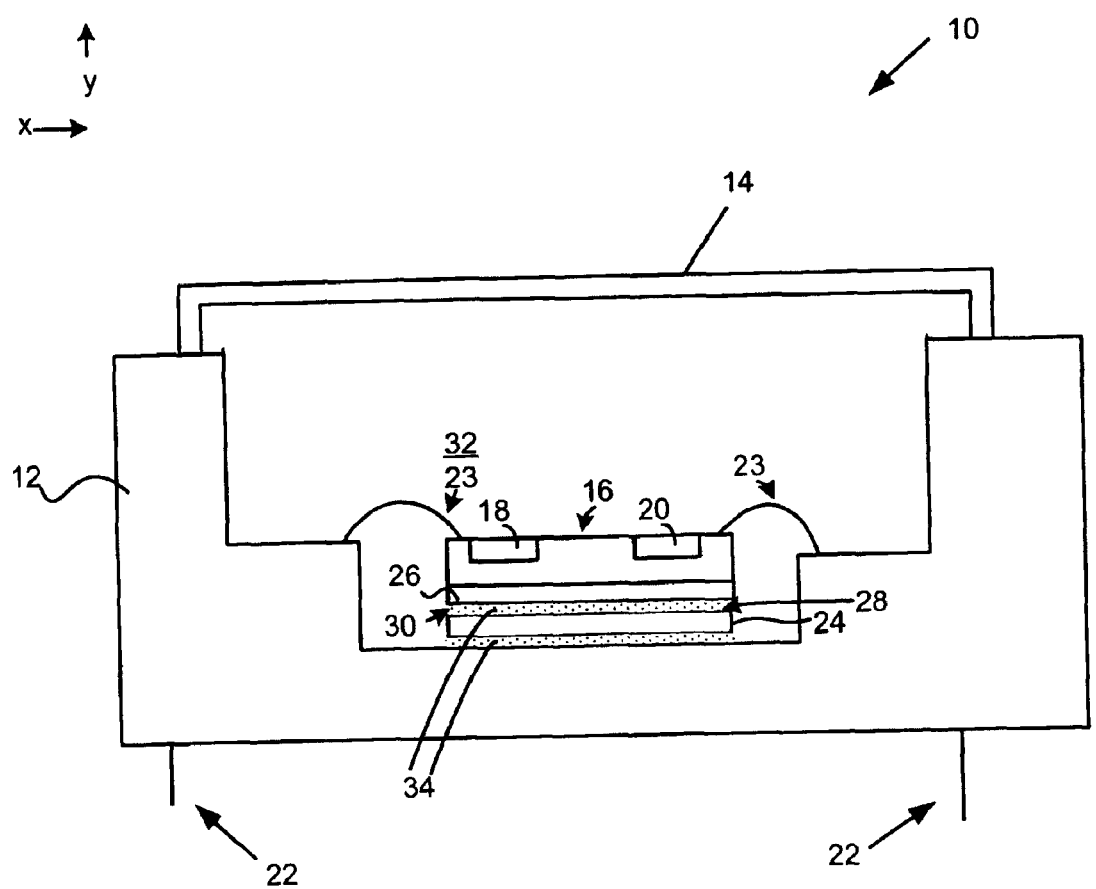
FIG. 2 schematically shows a cross-sectional view of the packaged microchip shown in FIG. 1 along line 2—2.

FIG. 2 schematically shows a cross-sectional view of the packaged microchip 10 shown in FIG. 1 along line 2—2. As noted above, the die 16 includes conventional silicon MEMS structure 18 to mechanically sense angular rotation, and accompanying electronics 20. Such structure 18 and electronics 20 (both shown schematically in FIG. 2) illustratively are formed on a silicon-on-insulator wafer, which has an oxide layer between a pair of silicon layers. As an example, among other things, the MEMS structure 18 may include one or more vibrating masses suspended above a silicon substrate 26 by a plurality of flexures. The structure 18 also may include a comb drive and sensing apparatus to both drive the vibrating masses and sense their motion. Accordingly, the electronics 20 may include, among other things, the driving and sensing electronics that couple with the comb drive and sensing apparatus, and signal transmission circuitry. Wires 23 electrically connect the accompanying electronics 20 with the pins 22. Exemplary MEMS angular rate sensors are discussed in greater detail in co-pending provisional U.S. patent applications identified by Ser. Nos. 60/364,322 and 60/354,610, both of which are assigned to Analog Devices, Inc. of Norwood, Mass. The disclosures of both of the noted provisional patents are incorporated herein, in their entireties, by reference.

In alternative embodiments, the MEMS structure 18 and accompanying electronics 20 are on different dies. For example, the die 16 having the MEMS structure 18 may be mounted to the package 12 by a first isolator 24, while the die 16 having the accompanying electronics 20 may be mounted to the package 12 by a second isolator 24. Alternatively, both dies may be mounted to the same isolator 24. In some cases, one of the dies 16 (i.e., a stress sensitive die 16) may be mounted on the isolator 24, while the other die 16 (i.e., a non-stress sensitive die 16) may be mounted directly to the package 12. It should be noted, however, that principles of illustrative embodiments apply to such embodiments.

The die 16, which is a microchip and/or integrated circuit, is sensitive to both linear and torsional stress. In this context, the term "sensitive" generally means that the operation of the structure 18 and/or electronics 20 on the die 16 can be compromised when subjected to such stress. For example, as suggested above, stress applied to the die 16 can cause the flexures suspending the mass to bend or compress to some extent. As a consequence, the mass may not vibrate at a prescribed rate and angle, thus producing a quadrature problem. As a further example, the comb drive may become misaligned, or the electronics 20 may become damaged. Any of these exemplary problems undesirably can corrupt the resulting data produced by the MEMS die 16. Accordingly, for these reasons, the die 16 or other microchip may be referred to as being "stress sensitive."

To solve these stress related problems, the isolator 24 is formed from a material having a CTE that more closely matches that of the die 16 than that of the package 12. In other words, the CTE of the isolator 24 should be closer to that of the die substrate 26 than that of the package 12. In illustrative embodiments, the package 12 is formed from a ceramic material, such as aluminum oxide (Al2O3), which generally has a CTE of about 7 ppm per degree Celsius. Moreover, in illustrative embodiments, the substrate 26 is silicon, which generally has a CTE of about 4 ppm per degree Celsius. Accordingly, in illustrative embodiments, the CTE of the isolator 24 is selected to have a CTE that is closer to 4 than it is to 7. As discussed below, illustrative embodiments use an isolator 24 produced from a material having a CTE that is substantially identical to that of silicon. Consequently, both the isolator 24 and substrate 26 should expand and contract at substantially the same rate in response to temperature changes. For additional details relating to CTE matching, see co-pending U.S. patent application Ser. No. 10/234,215, filed Sep. 4, 2002, and assigned to Analog Devices, Inc. of Norwood, Mass., the disclosure of which is incorporated herein, in its entirety, by reference.

While the CTE of the isolator 24 is matched with the CTE of the die 16, it is not matched with the CTE of the package 12. Accordingly, the package 12 and isolator 24 expand/contract at different rates as their temperatures change. Undesirably, absent further refinement, this rate variation can cause the second order effect of transmitting some thermal stress to the die 16. Accordingly, as noted above, in addition to matching the CTEs of the die 16 and isolator 24, illustrative embodiments also form the isolator 24 from a material having a modulus of elasticity that negates the noted second order stress.

More specifically, the isolator material is selected, relative to the modulus of elasticity of the package 12, to ensure that no more than a negligible thermal stress is transmitted from the package 12 to the die 16. In other words, the ratio of the two moduli (noted immediately below) is selected so that no more than a negligible amount of stress is transmitted from the package 12 to the die 16 (via the isolator 24). Such negligible amount of stress should have a negligible impact on die performance.

A negligible impact on performance means that die results (i.e., the signal generated by the die 16) should be satisfactory to produce usable data for its intended purpose. In other words, a negligible error may be considered to have occurred when the output results can be used (for their intended purpose) without the need for additional corrective circuitry to correct a stress-induced error. As known by those skilled in the art, such results depend upon the application for which the die 16 is produced. For example, if the die 16 is a roll-over angular rate sensor, a negligible error may be considered to occur if the die results are within about fifteen percent of the results it would produce in a completely unstressed condition. In other applications, however, to be a negligible error, the results must be much closer to the unstressed results.

In illustrative embodiments, the ratio of the modulus of elasticity of the isolator 24 to the modulus of elasticity of the package 12 is no less than about 0.33. For example, the modulus of elasticity of the isolator 24 may be about 100 Gpa., while the modulus of elasticity of the package 12 may be about 300 Gpa. Such relative moduli should permit the isolator 24 to attenuate stress to negligible levels.

A number of isolator materials thus may be used to effectuate various embodiments of the invention. For example, when used with an alumina package 12 and a silicon stud 16, illustrative embodiments may use an isolator 24 produced from silicon carbide (SiC). Among other benefits, the CTE of silicon carbide is virtually identical to that of silicon, while its modulus of elasticity is, in fact, greater than the modulus of elasticity of alumina. In particular, the above noted ratio of the two moduli is about 1.33. Accordingly, because of these relative properties, the points of contact between the die 16 and isolator 24 should contract and expand at substantially the same rates, while the isolator 24 effectively blocks any more than a negligible stress from being transmitted from the package 12 to the die 16. In other words, because of the noted moduli ratio, most of the stress resulting from the different expansion rates of the isolator 24 and package 12 are imparted on the package 12.

Of course, the isolator 24 may be produced from other materials. As a further example, when used with an alumina package 12 and a silicon die 16, the isolator 24 may be produced from aluminum nitride (AlN). In this embodiment, the CTE match is not as close as when used with silicon carbide, and the isolator modulus of elasticity is lower. Specifically, the moduli ratio is about 1.0 in this embodiment and thus, should produce satisfactory results. In yet other embodiments, the isolator 24 may be produced from boron nitride (BN) when used with an alumina package 12 and silicon die 16. It should be reiterated that discussion of specific materials is exemplary and thus, not intended to limit all embodiments of the invention. Accordingly, other materials may be used to effectuate the embodiments discussed herein.

MEMS designers typically strive to reduce the overall size and/or profile of MEMS devices. Illustrative embodiments further this goal by permitting the thickness of the isolator 24 to be thinner than if a higher modulus isolator material were used. Specifically, in addition to being a function of the isolator modulus of elasticity, the second order stress discussed above also is a function of the isolator thickness. Accordingly, the thickness of the isolator 24 may be reduced as its modulus of elasticity is increased. In illustrative embodiments, this is an inverse-linear relationship.

For example, assume that a packaged device 10 has an isolator 24 of a first material that produces satisfactory results at an initial thickness. If the isolator material is changed to a second material having modulus of elasticity that is twice that of the first material (e.g., from 100 Gpa. To 200 Gpa.), then its thickness may be reduced to half its initial size (e.g., from 0.008 inches to 0.004 inches) and still produce satisfactory results. In illustrative embodiments, as shown below, when used with a silicon die 16 and an alumina package 12, a silicon carbide isolator 24 may have a thickness of about 0.0042 inches or greater to produce satisfactory results.

Exemplary dimensions of the various components of the packaged die 16 thus follow. Note that on FIG. 2, the X direction indicates length, the Y direction indicates height (thickness), and the Z direction (i.e., not shown but perpendicular to the X and Y directions) indicates width. The packaged die 16 having the dimensions below has a silicon die 16, an alumina package 12, and a silicon carbide isolator 24.

Package 12: Height: 0.08 inches (about 2 millimeters);

Die 16: Length: 0.170 inches; Width: 0.140 inches; Height/thickness: 0.027 inches;

Isolator 24: Length: 0.170 inches; Width: 0.140 inches; Height/thickness: 0.0042 inches.

A packaged microchip 10 having these relative dimensions should perform satisfactorily for the purposes described herein. Of course, these dimensions are for illustration only. Other embodiments thus are not limited to these specific dimensions. Accordingly, a packaged microchip 10 having an isolator 24, package 12, and die 16 with different dimensions, within the above noted constraints (i.e., discussed above relating to the CTE and/or modulus of elasticity), also can provide a corresponding stress attenuation.

Figure 3:
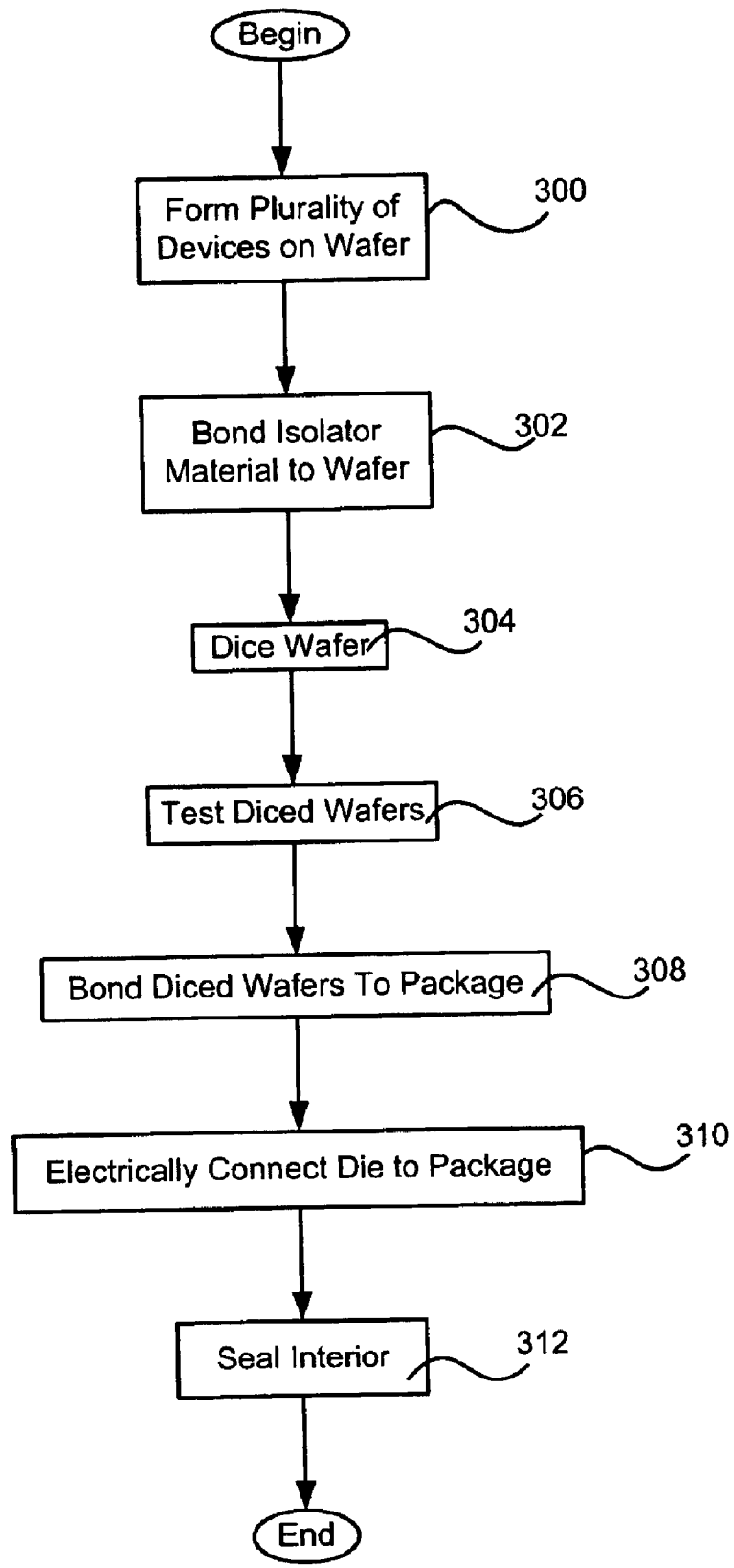
FIG. 3 shows a process of producing the packaged microchip shown in FIGS. 1 and 2.

FIG. 3 shows an exemplary process for producing a packaged MEMS device in accordance with illustrative embodiments of the invention. The process begins at step 300, in which a plurality of independent MEMS devices are formed on a single silicon wafer in accordance with conventional processes. For example, each MEMS device may be an acceleration sensor, such as an accelerometer or an angular rate sensor. The process then continues to step 302, in which an isolator material is bonded to the bottom side of the wafer. To that end, adhesive 34 is applied between the bottom surface of the wafer and the isolator material. The adhesive 34 may be applied to either or both the isolator material and the wafer. Such adhesive 34 preferably also has stress absorbing properties. In exemplary embodiments, the adhesive 34 is a silver filled glass adhesive material, such as Dexter product code number QMI3555, distributed by Dexter Electronic Materials of San Diego, Calif. Dexter Electronic Materials is a division of Loctite Corporation of Germany.

The process then continues to step 304, in which the wafer/isolator combination is diced by conventional processes to form a plurality of diced MEMS devices. In the example discussed above, each diced MEMS device includes a MEMS acceleration sensor/die 16 with an bonded isolator 24. The bonded isolator 24 illustratively has a top surface with a surface area that is substantially the same as that of the of the bottom surface of the die substrate 26. In alternative embodiments, the surface area of the isolator top surface is smaller than the surface area of the bottom surface of the die substrate 26.

Each diced wafer then is tested to ensure that it operates for its intended purpose (step 306). Conventional testing methods may be used. After a given diced wafer passes the testing step, the process continues to step 308, in which the given diced wafer is bonded to the bonding pad of the package 12. To these ends, in a manner similar to step 302, an adhesive may be applied between the bottom surface of the isolator 24 and the bonding pad of the package 12. The adhesive may be applied to either or both the isolator 24 and the bonding pad. In illustrative embodiments, the adhesive 34 may be the same as that noted above as being between the wafer and the isolator material.

The process then continues to step 310, in which the die 16 is electrically interconnected to the package 12. Next, at step 312, the lid 14 is secured to the top of the package 12, thus sealing the interior 32. If desired, a gas may be injected into the package interior 32 before the lid 14 is secured to the package 12. Note that steps 308–312 illustratively are executed for all diced wafers that pass the testing step 306.

Among other benefits, use of the process shown in FIG. 3 permits the entire diced wafer (i.e., die 16 with attached isolator 24) to be bonded to the package 12 in a single step. This simplifies the overall manufacturing process, thus saving time and manufacturing cost.

In some embodiments, adhesives may be used at steps 302 and 308 other than those discussed above. For example, such adhesives may include other silver glass materials, epoxies, cynate esters, and silicone. A high temperature organic adhesive, such as Siloxane, also should produce satisfactory results. Although desirable, in various embodiments, it is not necessary that these bonding agents have stress absorbing properties. In addition, other conventional means may be used to bond the respective elements. Accordingly, discussion of adhesive 34 is exemplary and not intended to limit the scope of various embodiments of the invention.

Although various exemplary embodiments of the invention are disclosed below, it should be apparent to those skilled in the art that various changes and modifications can be made that will achieve some of the advantages of the invention without departing from the true scope of the invention.

What is claimed is:

1. A packaged microchip comprising:
   a stress sensitive microchip;
   a package having a package modulus of elasticity; and
   an isolator between the microchip and the package, the isolator having an isolator modulus of elasticity greater than or equal to the package modulus of elasticity, the isolator modulus of elasticity and package modulus of elasticity having a relationship that causes no more than a negligible thermal stress to be transmitted to the microchip,
   the isolator having no electrical interconnects from the stress sensitive microchip therethrough.

2. The packaged microchip as defined by claim 1 wherein the stress sensitive microchip is a MEMS device implementing an inertial sensing device.

3. The packaged microchip as defined by claim 1 wherein the isolator includes one of silicon carbide, boron nitride, and aluminum nitride.

4. The packaged microchip as defined by claim 1 wherein the negligible thermal stress produces no more than a negligible performance effect upon the microchip.

5. The packaged microchip as defined by claim 1 wherein the isolator has an isolator thickness, the isolator thickness being inversely related to the isolator modulus of elasticity.

6. The packaged microchip as defined by claim 1 wherein the microchip has a bottom surface having a bottom surface area, the isolator having a top surface with a top surface area, the top surface area being substantially the same as the bottom surface area, the top surface area facing the bottom surface area.

7. The packaged microchip as defined by claim 1 wherein the microchip has a bottom surface having a bottom surface area, the isolator having a top surface with a top surface area, the top surface area being smaller than the bottom surface area, the top surface area facing the bottom surface area.

8. A packaged microchip comprising:
   a stress sensitive microchip;
   a package having a package modulus of elasticity; and
   means for causing no more than a negligible thermal stress to be transmitted to the microchip from the package, the causing means having a first modulus of elasticity greater than or equal to the package modulus of elasticity, the isolator having no electrical interconnects from the stress sensitive microchip therethrough.

9. The packaged microchip as defined by claim 8 wherein the first modulus of elasticity and package modulus of elasticity have a relationship that causes no more than a negligible thermal stress to be transmitted to the microchip.

10. The packaged microchip as defined by claim 8 wherein the causing means includes an isolator.

11. The packaged microchip as defined by claim 8 wherein the stress sensitive microchip is a MEMS device implementing an inertial sensing device.

12. The packaged microchip as defined by claim 8 wherein the microchip has a bottom surface having a bottom surface area, the causing means having a top surface with a top surface area, the top surface area being substantially the same as the bottom surface area, the top surface area facing the bottom surface area.

13. The packaged microchip as defined by claim 8 wherein the microchip has a bottom surface having a bottom surface area, the isolator having a top surface with a top surface area, the top surface area being smaller than the bottom surface area, the top surface area facing the bottom surface area.

* * * * *